United States Patent [19]

Pinkhasov

[11] Patent Number: 4,565,711

[45] Date of Patent: Jan. 21, 1986

[54] METHOD OF AND APPARATUS FOR THE COATING OF QUARTZ CRUCIBLES WITH PROTECTIVE LAYERS

[75] Inventor: Eduard Pinkhasov, Forest Hills, N.Y.

[73] Assignee: Wedtech Corp., Bronx, N.Y.

[21] Appl. No.: 626,055

[22] Filed: Jun. 29, 1984

[51] Int. Cl.[4] ............................ B05D 1/40; C23C 13/04
[52] U.S. Cl. ...................................... 427/50; 118/726; 118/727; 427/94; 427/255; 427/255.1
[58] Field of Search .................... 427/50, 94, 51, 255, 427/255.2; 118/726, 727

[56] References Cited

U.S. PATENT DOCUMENTS

| | | | |
|---|---|---|---|
| 2,665,226 | 1/1954 | Godley et al. | 427/50 |
| 3,036,549 | 5/1962 | Iwata et al. | 118/726 |
| 3,129,315 | 4/1964 | Radke et al. | 118/726 |
| 3,153,137 | 10/1964 | Drumheller | 118/726 |
| 3,451,845 | 6/1969 | Schüler | 427/255.2 |

*Primary Examiner*—John H. Newsome
*Attorney, Agent, or Firm*—Karl F. Ross; Herbert Dubno

[57] ABSTRACT

A silicon crucible for use in holding a silicon melt in the drawing of silicon bars for the production of silicon wafers in the semiconductor industry is provided with a protective coating, e.g. of silicon nitride, by the use of a vapor generator in which granules of a low electrical conductivity and low thermal conductivity material are disposed between a pair of electrodes and an electric current is supplied with induces localized vaporization from the granules at their contact points but without bodily melting the granules. Nitrogen can be applied to the mass as a carrier gas and to react with the silicon vapor thus formed.

18 Claims, 9 Drawing Figures

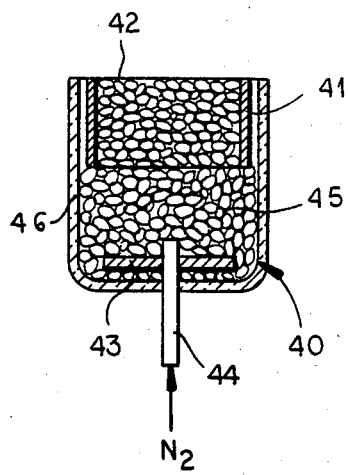 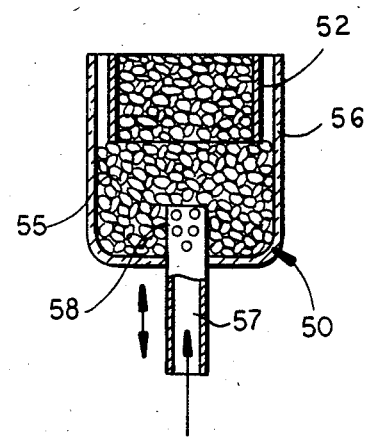 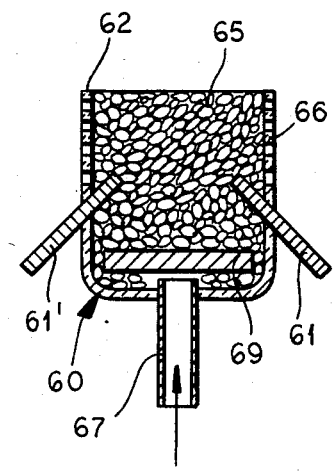
FIG.3　　　　FIG.4　　　　FIG.5
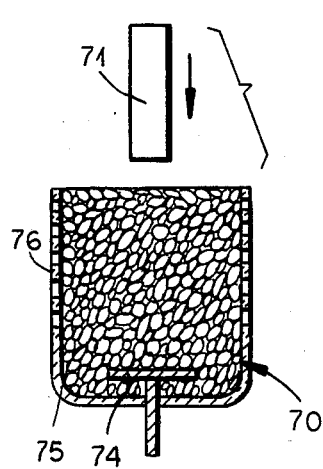 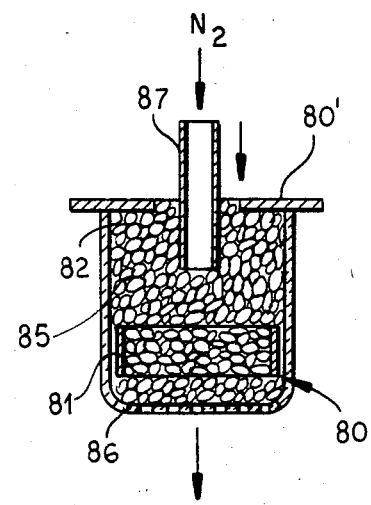 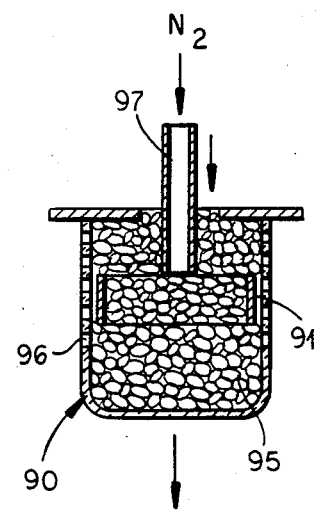
FIG.6　　　　FIG.7　　　　FIG.8

METHOD OF AND APPARATUS FOR THE COATING OF QUARTZ CRUCIBLES WITH PROTECTIVE LAYERS

FIELD OF THE INVENTION

My present invention relates to a method of and to an apparatus for the coating of quartz crucibles with protective layers.

The invention also relates to improvements in the production of silicon bars which can be cut up into wafers for the semiconductor industry and to other applications in which the production of elemental silicon vapor may be of importance.

BACKGROUND OF THE INVENTION

It is a current practice in the production of silicon wafers for the fabrication of semiconductors to draw a monocrystalline elemental-silicon bar from a melt of elemental silicon contained in an upwardly open quartz crucible, a monocrystalline seed being lowered into the melt and being then drawn upwardly while the silicon within the crucible is maintained in a molten state by induction heating via a coil surrounding the crucible.

Because the heating effect is applied from the exterior inwardly and the nature of the process is such that, for the requisite temperature of the molten silicon in the crucible, the walls of the quartz crucible may be heated to higher temperatures close to the softening point of the material from which they are constituted, one problem which has been encountered is that of softening of the crucible walls. Another problem is the mutual attack of the silicon melt upon the quartz crucible and the material of the quartz crucible on the melt so that deterioration of the crucible can occur and the melt can be contaminated.

The problem is all the more complicated because, especially when the melt must be maintained at the aforementioned high temperature for prolonged periods, e.g. tens of hours, it is necessary to provide support for the crucible by means of a refractory material such as a carbon or graphite jacket which is intended to surround the crucible.

These problems have long been recognized and efforts to solve them have been made.

For example, in my commonly assigned copending application, Ser. No. 618,192, June 7, 1984, filed, and entitled, *Method of and Apparatus for the Drawing of Bars of Monocrystalline Silicon*, I have described a method in which mutual attack at an interface between the molten silicon and the quartz crucible is entirely avoided by isolating the silicon melt from the quartz crucible with the aid of a mass of elemental silicon granules from which the melt was formed. This system utilizes the fact that elemental silicon can act as a thermal insulator and a contamination barrier in the granular state.

Another approach which has been attempted and has been found to be successful is to apply a coating to the interior of the quartz crucible of a material more resistant to attack than the silicon dioxide of this crucible.

Suitable materials for this purpose include silicon carbide, silicon nitride, boron carbide and boron nitride.

Indeed, in the commonly assigned copending application, Ser. No. 614,434, filed May 25, 1984, (U.S. Pat. No. 4,505,948), and entitled, *Method of Coating Ceramics and Quartz Crucibles with Material Electrically Transformed into a Wafer Phase*, I have described a method in which the silicon carbide, for example, for coating the quartz crucibles is generated by a low-voltage, high-current arc struck between a silicon electrode and a carbon electrode by initially contacting these two electrodes and drawing them apart, in a vacuum of at least $10^{-5}$ torr.

That application describes a special case of my earlier work in the field of coating utilizing such low voltages and currents and described, for example, in my copending application Ser. No. 494,302, filed 13 May 1983 as a continuation-in-part of Ser. No. 358,186 of 15 Mar. 1982 (U.S. Pat. No. 4,438,183), in turn a continuation-in-part of Ser. No. 237,670, filed 24 Feb. 1981 (U.S. Pat. No. 4,351,855), incorporating the subject matter of Disclosure Documents Nos. 078,337, 078,334 and 078,329, all of 26 Feb. 1979 and Disclosure Document No. 082,283 of 5 July 1979.

While those systems have been found to be effective in generating the coating compounds and in applying them to a variety of substrates including the quartz crucibles in question here, in many cases the generation of a vapor phase of coating compounds or coating elements leaves much to be desired, especially when at least one of the materials adapted to form a coating or to be vaporized is of limited electrical conductivity.

OBJECTS OF THE INVENTION

It is, therefore, the principal object of the present invention to provide a method of generating a vapor of a material consisting of at least one element of comparatively low conductivity in the solid form and specifically silicon or a compound of silicon, whereby disadvantages of earlier systems are obviated.

Another object of this invention is to provide an improved method of forming compounds in a vapor state for coating purposes.

It is yet another object of this invention to provide an improved method of coating silicon crucibles, especially for the purposes described, whereby highly uniform protective coatings can be formed on the interiors of such crucibles so as to enable the coated crucibles to be used with improved results in the fabrication of silicon wafers and the like.

It is yet another object of the invention to provide a method which reduces the cost of coating quartz crucibles with protective layers while nevertheless yielding more homogeneous coatings more efficiently than has been possible heretofore.

It is also an object of this invention to provide an efficient apparatus for carrying out the improved method of coating quartz crucibles.

SUMMARY OF THE INVENTION

My invention is based upon my discovery that certain materials, important among them being elemental silicon, when in a granular state and of poor thermal conductivity and even electrical conductivity so that they are difficult to melt, nevertheless can be locally transformed into the vapor state by applying en electric potential across electrodes between which a body of such granules are disposed. While I am not fully able to explain all of the reasons why the method of this invention is effective, it appears that the application of an electric potential between electrodes bridged by a mass of granules of elemental silicon does result in the passage of some electric current through the mass in spite of the poor conductivity of elemental silicon. The electric current flow, however, between the particles of the mass appears to be concentrated at the comparatively few contact points between the particles, and at these points, because of their small area and high contact resistance, the ohmic loss is considerable and the $I^2R$ heat which is generated is sufficient at the specific locality to immediately vaporize a portion of the surface of the granules at the contact locations without bodily melting the granules.

This phenomenon appears to be a consequence also of the comparatively poor thermal conductivity of the granules which prevents them from effectively dissipating the contact heat generated by conduction.

I have found that this phenomenon surpisingly can occur utilizing voltages of 50 to 60 volts applied across the mass of granules or a portion thereof and, in any event, voltages sufficiently low as to preclude a breakdown or arcing across the electrodes and the gap between them containing the granules. The currents which may be used can be 50 to 70 amperes. These parameters vary depending upon the nature of the granules. In general terms, therefore, the voltages should be sufficient to effect current flow without arc discharge and the current sufficient to achieve vaporization without melting of the granules into a pool of metal.

While the principles of this invention can be applied to granules of various vaporizable materials which are of relatively low electrical thermal conductivity generally, I have found them to be most useful in the generation of vapors of silicon and boron utilizing granules of these elements.

Another advantage of the present invention is that I can form vapors of high purity compounds such as silicon carbide, silicon nitride, boron carbide and boron nitride in situ utilizing the same principles. One of the elements of each such compound can derive from the granules while another element can be contributed by a gas which can be introduced into the mass. The gas, for example, nitrogen, may also serve as a carrier for the contents which are then formed onto a surface which is to be coated with the compounds.

Alternatively, the second element of the compound may be contributed by granules which may be mixed with those of silicon and boron in the mass.

According to an important aspect of the invention, these principles are utilized to apply coatings of elemental silicon or elemental boron upon a substrate or, even more importantly, to coat, e.g. the quartz crucibles mentioned previously, with refractory protective coatings such as silicon carbide, silicon nitride or boron carbide.

The boron and silicon vapors may be utilized directly in the preparation of coatings which can be utilized for various purposes, e.g. the elemental-silicon deposits can be utilized in the preparation of polycrystalline silicon layers of a type which has recently become of interest in the semiconductor field.

In the coating of quartz crucibles, I have found it to be advantageous to subject the quartz crucible prior to coating to a surface treatment by a sandblasting operation. For the sandblasting operation I may use sharp sand, emery, or any other particulate abrasive, or even metal particles. Surprisingly, it is not critical that these particles be harder than the quartz which is subjected to the sandblasting treatment and the parameters of the sandblasting are likewise not critical as long as practically the entire surface to be coated is uniformly treated in this manner. It appears that at least some surface effect results from the treatment so that the coating forms more regularly and has a greater adhesion. The term "sandblasting" is thus here used to identify any surface treatment in which particulates are directed against the surface to be coated in entrainment with high pressure air or another carrier gas.

The electrodes may be composed of the same materials as the granules for highest purity of the coating. Thus the electrodes may be composed of Si or B for the production of Si or B containing vapor. The electrodes can be initially heated to promote conductivity and then cooled to prevent melting or vaporization therefrom.

I have also found it to be advantageous to preheat the surface treated quartz crucible prior to the treatment by at least several hundred ° C. over ambient temperature although here again the precise temperature to which the crucible is preheated is not significant. The temperature used, however, should be at least 100° C. below the softening point of the quartz crystal.

According to a feature of the invention, the granules, e.g. of silicon or boron, are placed in a vessel which can be formed with one or more openings, preferably with a multiplicity of perforations, through which the vapor can emerge, this vessel being provided with a feed for a carrier gas and/or a gas capable of reacting with the elemental component of the granules. The carrier gas entrains the vapor through the perforations in the vessel onto the surface with which the vessel is juxtaposed and means is provided for sweeping the perforated surface of the vessel along the surfaces of the crucible to be coated, but preferably with a constant spacing therefrom.

Naturally, the vessel containing the granules is also provided with a pair of electrodes in spaced-apart relationship and separated by the granular mass while an electric current source is connected across the electrodes to provide the electric current which induces the vaporization of the granular material in the manner described. These electrodes can be cooled by the passage of a coolant therethrough.

BRIEF DESCRIPTION OF THE DRAWING

The above and other objects, features and advantages of the present invention will become more readily apparent from the following description, reference being made to the accompanying drawing in which:

FIGS. 3-8 are axially sectional views of various vessel and electrode configurations which can be utilized in the practice of this invention.

SPECIFIC DESCRIPTION

Figure 1:
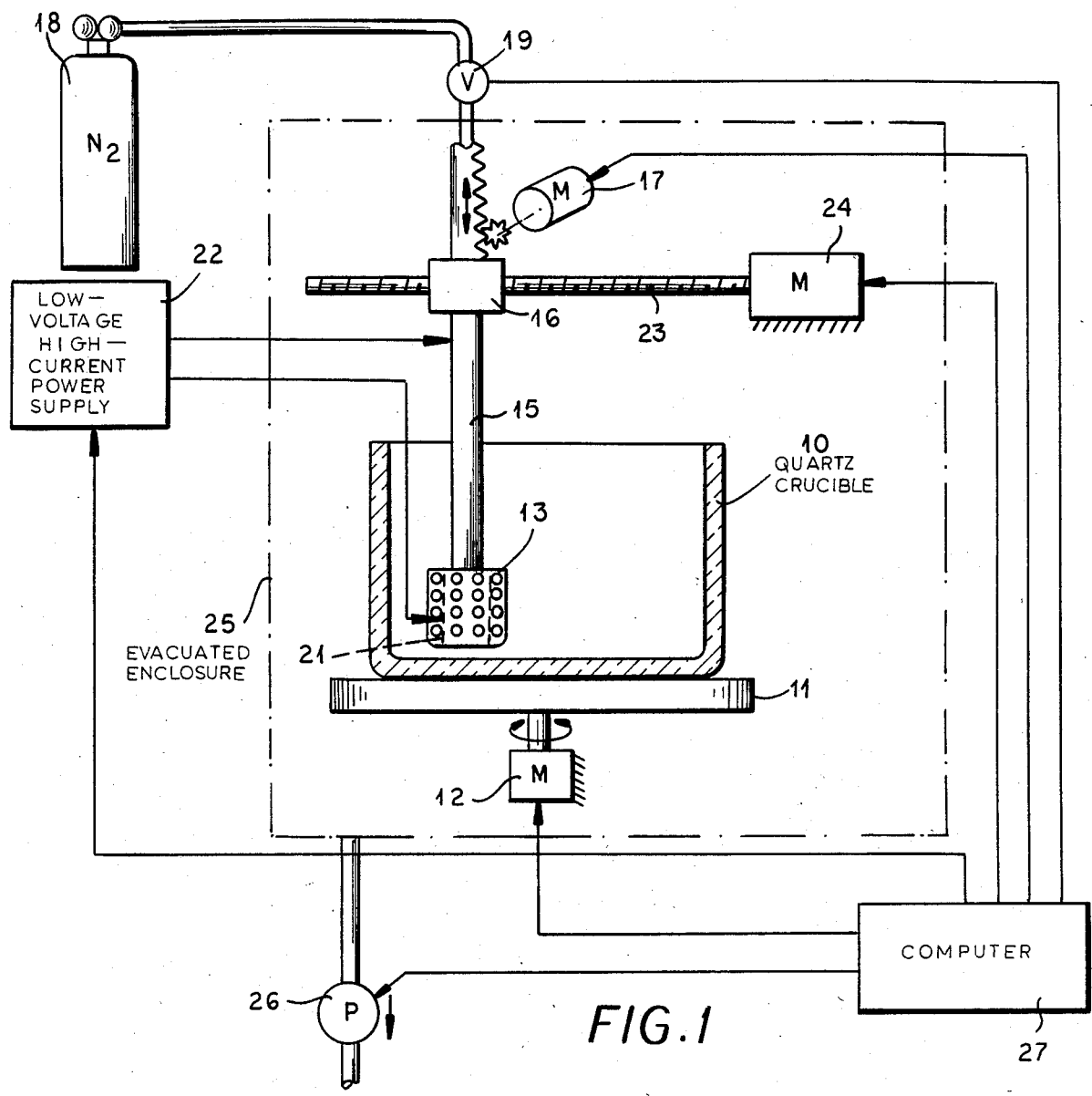
FIG. 1 is a vertical section through an apparatus according to the invention diagrammatically showing the coating of a quartz crucible utilizing the principles of this invention.

From FIG. 1 it can be seen that an apparatus for the coating of a quartz crucible 10 of the type utilized in the melting of silicon for the drawing of monocrystalline silicon bars in the production of silicon wafers for the semiconductor industry, can comprise means for supporting the crucible which, in the embodiment illustrated, is a turntable 11, rotatable by a motor 12.

Within the crucible, a vessel 13 is provided, this vessel having perforations 14 through which the vapor can emerge. Vessels for the generation of vapor according to the invention can have various configurations and reference may be had to FIGS. 3–9 described below in this connection. The vessel 13 is carried by a support 15 which is electrically displaceable in a carriage 16 by a motor 17. This support may be provided with a multiplicity of ducts, e.g. for cooling water when the members act as an electrode as shown and as described with reference to FIG. 2. It also may be provided with a central passage through which nitrogen or some other reactant and/or carrier gas may be fed.

In the illustrated embodiment, the nitrogen is supplied by a tank 18 via a valve 19 to the water-cooled electrode 20 which is separated by a mass of silicon granules (not visible in this Figure) from the counter-electrode 21 which also may be water cooled. Both electrodes can be composed of copper. The electrodes are connected to a low-voltage, high-current power supply 22 which is preferably of the alternating current type, but may also be a direct current power supply. The power supply has a variable output.

The carriage 16 is displaceable in turn radially as represented by the lead screw 23 and a motor 24. The entire assembly is received in the evacuated enclosure 25 whose vacuum pump is shown at 26. A computer such as a numerical controller 27 can be provided to provide process and position control.

In operation, the vaporized silicon generated between the electrodes reacts almost instantly with a portion of the introgen supplied to produce the silicon nitride $Si_3N_4$ which is entrained by the nitrogen acting as a carrier gas onto the surface of the quartz crucible 10 which is juxtaposed therewith. With the rotation of the turntable 11 by the motor 12 and the drive of the carriage 16 by the motor 24 and the elevation of the vessel 13 by the motor 17 under the control of the computer 27, all internal surfaces of the crucible are juxtaposed with the vapor generator 13, etc., and are uniformly coated with the vapor. The apparatus is obviously suitable for use with crucibles of any size utilizing an appropriate program. The degree of vacuum which may be applied, e.g. up to $10^{-5}$ torr will depend upon the degree of contamination of the coating which may be tolerable but effective coatings are obtained even at atmospheric pressure once the crucible has been flushed with nitrogen. When a nitride is not to be produced, argon or another inert gas can be substituted as the carrier gas and in many cases a carrier gas may be dispensed there since the vapor, immediately upon its formation, tends to expand and emerge from the vessel. Furthermore, when granules of boron carbide and silicon carbide are utilized instead of elemental silicon, coatings of these materials are generated and coatings of boron carbide, and silicon carbide can be applied also by mixing a few granules of carbon with the mass of granular silicon and/or boron.

Figure 2:
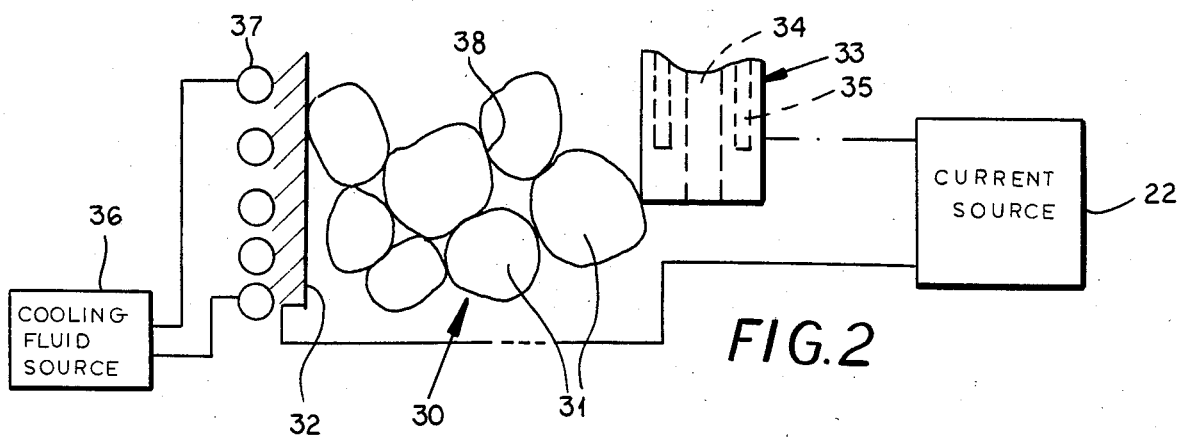
FIG. 2 is a diagram illustrating these principles.

In FIG. 2 I have illustrated the principles of the invention in diagrammatic form. The mass 30 of silicon granules 31 is here shown to be disposed between an electrode 32 and an electrode 33, the latter being a tube through the central passage 34 of which the nitrogen or other reactive or carrier gas can be supplied. This electrode can be provided with cooling passages as represented at 35 as well and a cooling fluid source 36 can circulate cooling fluid through this electrode and the passages 37 of the electrode 32. When the low-voltage high-current power supply 22 then applies its voltage between the electrodes 32 and 33, although the granules are only limitedly conductive, there is a significant flow of current through each of the contact points 38 between the mutually contacting particles. Since the area of contact at each of these points is small, the current density is considerable and since the contact resistance is high, the product of the square of the current and the resistance ($I^2R$), representing the heating generated is considerable and is sufficient, assuming the current flow is sufficient, to vaporize contact regions of the granules. These vapors can react on formation with the gaseous medium in their environment to form silicon nitride in the manner described. The electrodes 32 and 33 can be composed of silicon and initially heated to promote conductivity. They are cooled once the vapor-production commences.

FIGS. 3–8 show various coating arrangements. For example, the vessel 40 is provided with an annular electrode 41 adjacent its open end 42 and with an electrode consisting of a plate 43 and a rod 44 secured thereto at the bottom of this vessel. The mass 45 of granules between the electrodes is subjected to vaporization in the manner described and the vessel may have a perforated lateral wall 46. The vapors rise and pass out of the perforations for deposition.

In the arrangement shown in FIG. 4, the vessel 50 has an annular electrode 52 as described in connection with FIG. 3, but in place of the lower electrode, a copper tube 47 is utilized and has its end 58 within the vessel perforated to distribute the nitrogen gas which is admitted to the tube to act as a carrier gas. In this embodiment, the wall 56 of the vessel is not perforated and the silicon nitride vapors emerge from the top.

In the embodiment of FIG. 5, the vessel 60 is open at its mouth 62 and has a perforated wall 66 surrounding the mass 65 of granules. The two electrodes 61, 62 here reach into the mass and a plate 69 is provided as a baffle to support the mass of granules and deflect the stream of nitrogen from the tube 67 outwardly and uniformly through the mass.

In FIG. 6 I have shown an embodiment of the invention which utilizes principles of my earlier applications. Here the vessel 70 contains the mass 75 of silicon granules and an electrode 74, the vessel being provided with a perforated wall 76. The electrode 71 in this embodiment can be lowered into the mass of granules to establish the electrical contact.

In the embodiment of FIG. 7, which can be utilized for the coating of substrates below the vessel 80, the bottom wall 86 of this vessel is perforated while a cover 80' is provided across the mouth 82. The tube electrode 87 opens into the mass 85 of granules from above and cooperates with the annular electrode 81 within this mass to pass the electric current therethrough. The vapors emerge through the perforated wall 86 and deposit upon the substrate. The entire wall of the vessel 80 (FIG. 8) is perforated as shown at 96 and the annular electrode 91 is more closely juxtaposed with the electrode and tube 97, the latter being lowered into the mass 95 of granules as vaporization procedes to maintain the electrical contact. The vapors here emerge from all sides of the vessel to coat a substrate surrounding same.

Figure 9:
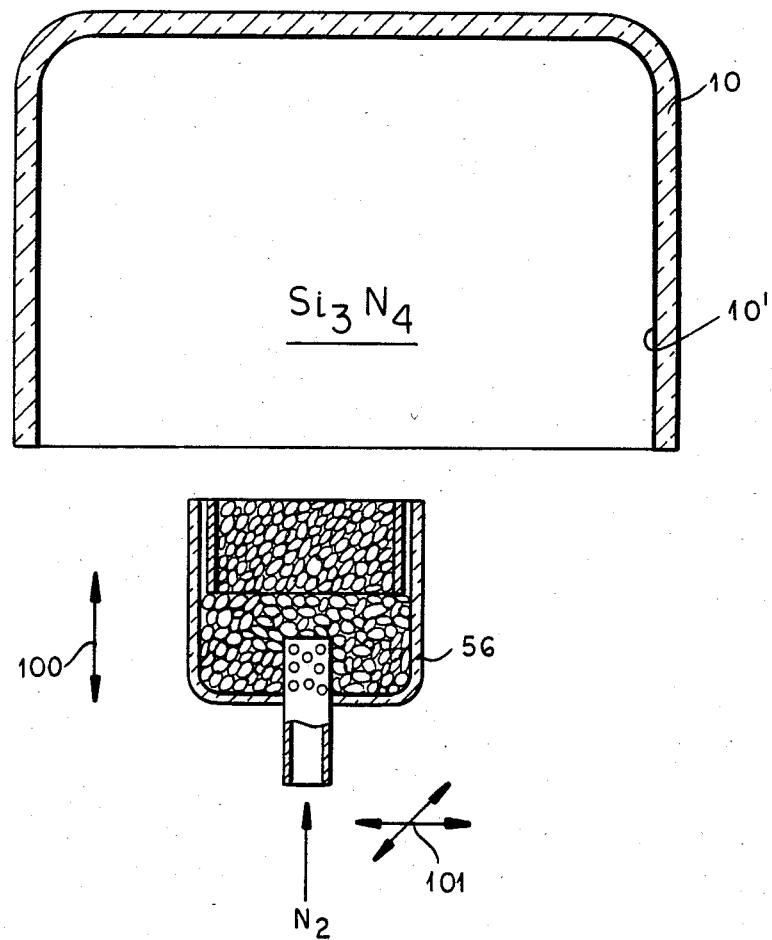
FIG. 9 is another view in section showing the coating of a quartz crucible according to the invention.

In FIG. 9 we have shown the principles of the invention as applied to the embodiment of FIG. 4 for coating the quartz crucible 10 with the silicon nitride coating 10'. Here the quartz crystal is inverted in an appropriate holder (not shown) and the vapor generator of FIG. 4 is utilized and can be raised and lowered as represented by the arrow 100 and shifted transversely as represented by the arrows 101 to uniformly direct the outflowing vapors substantially to all surfaces of the overturned crucible.

SPECIFIC EXAMPLE

The quartz crucible for the production of monocrystalline silicon bars from a silicon melt having an inner diameter of about 10 inches, a depth of about 6 inches and a wall thickness of 3 mm is juxtaposed with a vapor generator as illustrated in FIG. 1 after havings its internal surfaces sandblasted with emery grains of a particle size of about 0.5 mm average using a sandblast pressure between 75 to 100 psi. The crucible was preheated to a temperature of about 800° C. prior to coating.

The pure silicon granules had an average particle size of about 4 mm and the mass was received between two water-cooled silicon electrodes, one of which applied nitrogen. The voltage applied ranged between 50 and 60 volts and the current flow as between 50 and 70 amperes to generate the silicon carbide vapor and the vapor generator was held at a distance of about 2 cm from the surface to be coated and swept uniformly over the surface to deposit a coating to a thickness of about 5 microns. The resulting coated crucibles were found to resist detrimental effects in the drawing of silicon bars so that the crucible was usable for far longer periods than uncoated quartz crucibles.

I claim:

1. A method of generating a vapor at least one component of which is derived from a granular material which comprises the steps of:
    disposing a mass of granules of said material between a pair of electrodes, said electrodes being unconnected to each other except through a power supply and by said mass; and
    applying an electric current between said electrodes and through said mass of granules of an intensity sufficent to induce local vaporization of said material at contact points between granules thereof by the current passing therethrough without bodily melting said granules.

2. The method defined in claim 1, further comprising the step of entraining the vapors produced in said mass with a carrier gas.

3. The method defined in claim 1, further comprising the step of depositing the vapors thus produced on a substrate to form a coating thereon.

4. The method defined in claim 2, further comprising the step of contacting the vapor entrained by said carrier gas with a substrate to deposit a coating thereon.

5. The method defined in claim 1, further comprising the step of reacting an element vaporized from said granules with an element of a gas supplied to said mass to form a vapor of a compound of said elements.

6. The method defined in claim 5 wherein said compound of said elements is coated onto a substrate.

7. The method defined in claim 6 wherein the element vaporized from said granules is silicon or boron, the element from said gas is nitrogen and said substrate is a surface of a quartz crucible.

8. A method of coating a quartz crucible with a protective coating which comprises the steps of:
    sandblasting an inner surface of said quartz crucible
    juxtaposing said inner surface of said quartz crucible with a vessel containing a mass of granules of a material adapted to form at least one element of a coating on said surface and having low thermal and electrical conductivity, said vessel having at least one vapor-emitting opening;
    passing an electric current through at least a portion of said mass of an intensity sufficient to introduce vaporization of granules of said material on contact points therebetween without bulk melting of said granules to generate vapor emerging from said opening and depositing upon said surface, and
    relatively displacing said vessel and said crucible to uniformly deposit said vapor over the entire extent of said surface.

9. The method defined in claim 8 wherein said granules are composed of silicon carbide or boron carbide and the coating formed on said surface is composed of silicon carbide or boron carbide.

10. The method defined in claim 8 wherein said granules are composed of silicon or boron.

11. The method defined in claim 10, further comprising the step of passing nitrogen through said vessel to entrain said vapor onto said surface, the nitrogen reacting with said element to form silicon nitride or boron nitride at said coating.

12. The method defined in claim 11 wherein the electric current passed through said portion of said mass is supplied at a voltage of 50 to 60 volts and a current of 50 to 70 amperes.

13. The method defined in claim 12, further comprising the step of heating said quartz crucible prior to the coating thereof to an elevated temperature less than the softening point of said crucible.

14. An apparatus for coating a crucible comprising:
    a vessel provided with at least one opening and containing a mass of granules of low thermal and electrical conductivity of a material including an element adapted to form a coating from a vapor phase;
    a pair of electrodes in contact with said mass and disposed across at least a portion thereof;
    means for supplying an electric current through said portion of a magnitude sufficient to induce localized vaporization of granules at mutual contact points of said granules in said portion without substantial melting of said granules whereby vapors pass through said opening for coating a substrate juxtaposed therewith;
    means for supporting said vessel in juxtaposition with said substrate; and
    means for passing a gas through said mass, the means for passing said gas through said mass being one of said electrodes and said gas adapted to react with said element in said mass.

15. The apparatus defined in claim 14, further comprising means for relatively displacing said vessel and said substrate to sweep said vapor uniformly over an entire surface of said substrate.

16. The apparatus defined in claim 15 wherein the electrode admitting gas to said mass is a tube opening into said mass from above and said vessel has perforations along at least one wall for discharging vapor.

17. The apparatus defined in claim 15 wherein at least one of said electrodes is annular and another of said electrodes is elongated and is coaxial with said annular electrode.

18. The apparatus defined in claim 17, further comprising means for cooling at least one of said electrodes.

* * * * *